United States Patent
Kao et al.

(10) Patent No.: US 6,175,162 B1
(45) Date of Patent: Jan. 16, 2001

(54) SEMICONDUCTOR WAFER HAVING A BOTTOM SURFACE PROTECTIVE COATING

(75) Inventors: Pai-Hsiang Kao, Saratoga; William Jeffrey Schaefer, San Jose; Nikhil Vishwanath Kelkar, Santa Clara, all of CA (US)

(73) Assignee: National Semiconductor Corporation, Santa Clara, CA (US)

( * ) Notice: Under 35 U.S.C. 154(b), the term of this patent shall be extended for 0 days.

(21) Appl. No.: 09/391,854

(22) Filed: Sep. 8, 1999

Related U.S. Application Data

(63) Continuation of application No. 09/006,759, filed on Jan. 14, 1998, now Pat. No. 6,023,094.

(51) Int. Cl.$^7$ .................................................. H01L 23/28
(52) U.S. Cl. ............................................ 257/787; 257/783
(58) Field of Search ................................. 257/782, 783, 257/787, 679

(56) References Cited

U.S. PATENT DOCUMENTS

| | | | |
|---|---|---|---|
| 5,083,191 | * | 1/1992 | Ueda et al. . |
| 5,294,812 | | 3/1994 | Hashimoto et al. . |
| 5,504,374 | * | 4/1996 | Oliver et al. . |
| 5,536,970 | * | 7/1996 | Higashi et al. . |
| 5,892,288 | * | 4/1999 | Muraki et al. . |
| 5,925,936 | * | 7/1999 | Yamaji . |
| 6,034,437 | * | 3/2000 | Shibata . |

FOREIGN PATENT DOCUMENTS

| | | | |
|---|---|---|---|
| 61-84824 | 4/1986 | (JP) | ...................................... 257/797 |
| 63-285955 | 11/1988 | (JP) | ...................................... 257/790 |
| 4-116955 | 4/1992 | (JP) | ...................................... 257/797 |

\* cited by examiner

*Primary Examiner*—Sheila V. Clark
(74) *Attorney, Agent, or Firm*—Beyer Weaver & Thomas LLP

(57) ABSTRACT

Disclosed is a packaged integrated circuit device. The device includes a die having a plurality of electrical contacts on a first surface of the die and a protective film adhered directly to a back surface of the die, the protective film being thick enough to allow laser marking of the protective film without the laser penetrating to the die. In one preferred embodiment, the protective film of the device is a thick film formed by screen printing. In a preferred embodiment, the protective film has a thickness of between about 1.5 and 5 mils. Also, disclosed is a method of fabricating a semiconductor wafer having a wafer substrate with a top surface and a bottom surface and a plurality of dies. In this embodiment, the method includes providing a plurality of dies on the top surface of the wafer substrate, applying a thick film over the bottom surface of the wafer substrate, adhering the thick film to a mounting tape that is not ultraviolet curable, and dicing the wafer to separate the dies. The thick film reduces chipping along edges of the separated dies.

7 Claims, 3 Drawing Sheets

SEMICONDUCTOR WAFER HAVING A BOTTOM SURFACE PROTECTIVE COATING

CROSS REFERENCE TO RELATED APPLICATIONS

This application is a Continuation of Ser. No. 09/006,759, filed Jan. 4, 1998, now U.S. Pat. No. 6,023,094.

This application is related to U.S. patent application Ser. No. 08/517,603 filed Aug. 22, 1995 entitled, "Thermally Enhanced Micro-Ball Grid Array Package" by Rajeev Joshi having assignment rights in common with the present invention, which is herein incorporated by reference.

BACKGROUND OF THE INVENTION

The present invention relates generally to integrated circuit (IC) devices and, more particularly, to a semiconductor wafer having a bottom surface that is coated with a protective coating prior to the performance of a wafer dicing, or die singulation, operation.

Currently, in order to remain competitive in the IC industry, IC process engineers must continuously increase device yield per wafer or lot. That is, process engineers seek to increase the number of usable semiconductor devices per wafer. Since any step in the fabrication process may detrimentally affect the IC device yield, process engineers seek to optimize each step and, as a result, reduce the number of lost IC devices for the optimized step.

For example, a conventional dicing, or sawing, process is one fabrication step that is likely to result in a substantial loss of devices. In general, when a wafer is diced, chipping may occur along the dicing edges of the individual IC devices. This chipping may then lead to the formation of cracks throughout the IC device, which cracking may damage the IC device and make the IC device unusable for its intended application. In other words, the chipping results in IC devices that are more vulnerable to stress and more susceptible to damage. As a result of an increase in unusable IC devices due to chipping, the IC device yield per wafer or lot is significantly reduced, and product reliability is compromised.

One type of IC device that may be chipped during the dicing operation is a flip chip device. During the dicing process, the flip chip device is cut away from the other flip chip devices of the wafer. The separated flip chip device may have, for example, rough edges as a result of the dicing process. After the flip chip device is separated from the other flip chip devices, the flip chip device is then packaged and/or mounted to a printed circuit board. As a result of chipping, the flip chip device may suffer various form of damage at any point subsequent to the dicing process. For example, the flip chip device may be damaged while it is being handled prior to mounting or packaging.

FIG. 1 is a side view of a conventional flip chip type device 100. The flip chip 100 includes a die 102 that typically has a plurality of conventionally fabricated IC device structures. These IC device structures may include, for example, transistors and interconnect layers. The die 102 has a top surface 108 that includes bump pads (not shown). Bumps 106 are formed on the bump pads of the top most surface 108. This top surface 108 is opposite a bottom surface 104 of the die 102. The bottom surface 104 is conventionally left bare, or exposed For example, the bottom surface 104 is bare silicon.

There are many problems associated with a conventional wafer that has conventional devices with exposed bottom surfaces. For example, one problem is the aforementioned chipping during the dicing operation. That is, the exposed bottom surface fails to provide sufficient mechanical protection under certain stress inducing conditions. The exposed bottom surface also fails to provide protection from electrostatic shock or light induced bias for flip chip applications. That is, the devices may have functional problems due to photogenerated carriers when the bottom surface (e.g., 104) of the die (e.g, 102) is exposed to light, or the devices may be subject to an undesirable electrostatic shock during handling of the device subsequent to the dicing operation.

The aforementioned problems all contribute to a decrease in production yield. Consequently, there is a need for an improved wafer that provides a solution to the aforementioned problems. For example, there is a need for an improved wafer that is less susceptible to mechanical stress during and after a dicing operation. Additionally, there is a need for a method for making such an improved wafer.

SUMMARY OF THE INVENTION

To achieve the foregoing and other objects and according to the purpose of the present invention, a packaged integrated circuit device is disclosed. The device includes a die having a plurality of electrical contacts on a first surface of the die and a protective film adhered directly to a back surface of the die, the protective film being thick enough to allow laser marking of the protective film without the laser penetrating to the die. In one preferred embodiment, the protective film of the device is a thick film formed by screen printing. In a preferred embodiment, the protective film has a thickness of between about 1.5 and 5 mils.

In another embodiment, a semiconductor wafer is disclosed. The wafer includes a multiplicity of semiconductor dies, and each die has a plurality of electrical contacts that are exposed on a first surface of the wafer. The wafer further includes a protective thick film adhered directly to a second surface of the wafer. The protective film is thick enough to allow laser marking of the protective film without the laser penetrating to the die.

In another aspect of the invention, a method of fabricating a semiconductor wafer having a wafer substrate with a top surface and a bottom surface and a plurality of dies is disclosed. The method includes providing a plurality of dies on the top surface of the wafer substrate. A plurality of electrical contacts are disposed on each die. The method further includes printing a thick film upon the bottom surface of the wafer substrate such that the thick film is thick enough to allow laser marking of the thick film without the laser penetrating to one of the plurality of dies. In a preferred embodiment, the printing act includes placing a screen across the bottom surface of the wafer substrate, where the screen has a first end and a second end that is opposite the first end, depositing a predefined amount of material at the first end of the screen, and dragging a squeegee from the first end to the second end of the screen such that the material is thinly deposited through the screen and across the bottom surface of the wafer substrate to form the thick film. In another preferred embodiment, the method further includes adhering a mounting tape to the thick film, and dicing the wafer such that the dies are separated from each other. The mounting tape is not an especially adhesive type tape.

In another embodiment, a method of fabricating a semiconductor wafer having a wafer substrate with a top surface and a bottom surface and a plurality of dies is disclosed. In this embodiment, the method includes providing a plurality of dies on the top surface of the wafer substrate, applying a thick film over the bottom surface of the wafer substrate, adhering the thick film to a mounting tape that is a UV type tape, and dicing the wafer to separate the dies. In this embodiment, the thick film reduces chipping along edges of the separated dies.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

Methods and apparatus for protecting IC devices of a wafer during and after a dicing operation are described below. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

In general, the present invention includes a wafer having a protective film for substantially preventing damage to the dies of the wafer during and after the dicing process. For example, the protective film substantially prevents chipping along the dicing edges of the dies. Although the following description is in reference to flip chip devices, of course, it should be well understood to those skilled in the art that the present invention is not limited to flip chip devices, but may be implemented on any device that has an exposed bottom surface during the dicing process, such as a flash memory device or a chip size package (CSP). One example of a CSP is a ball grid array package type, which package type is described in U.S. patent application Ser. No. 08/517,603 (Attorney Docket No. NSC1P073) filed Aug. 22, 1995 entitled, "Thermally Enhanced Micro-Ball Grid Array Package" by Rajeev Joshi having assignment rights in common with the present invention, and which is herein incorporated by reference.

Figure 1:
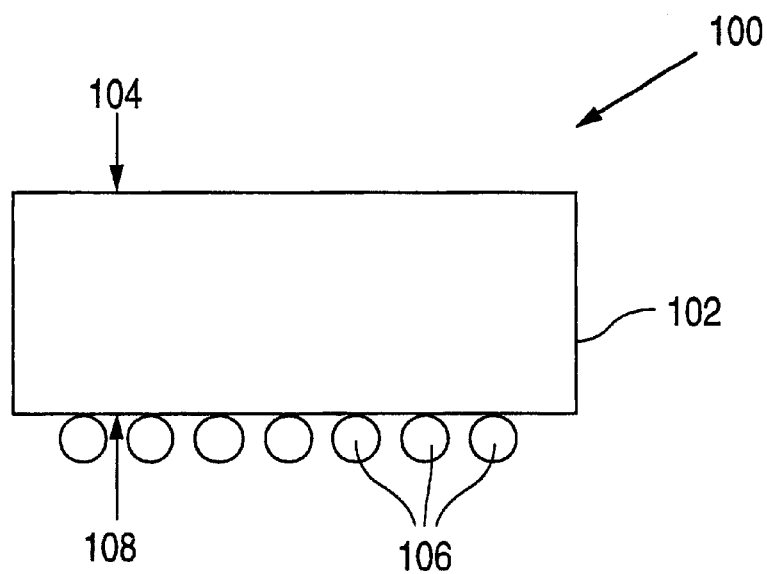
FIG. 1 is a diagrammatic side view of a conventional flip chip type device.
Figure 2:
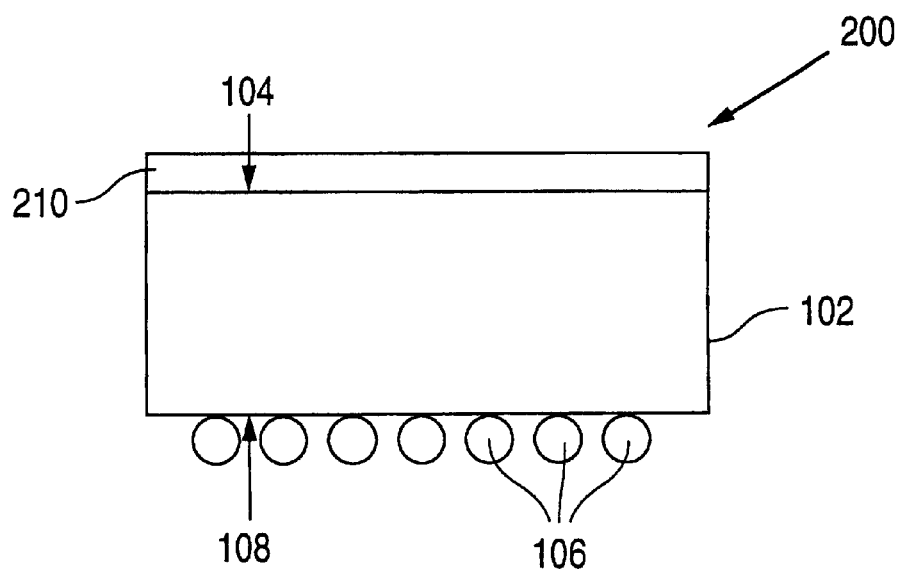
FIG. 2 is a diagrammatic side view of a flip chip device in accordance with one embodiment of the present invention.

FIG. 2 is a side view of a flip chip device 200 in accordance with one embodiment of the present invention. The flip chip 200 includes a die 102 that typically has a plurality of conventionally fabricated IC device structures. These IC device structures may include, for example, transistors and interconnect layers. The die 102 has a top surface 108 that includes a plurality of electrical contacts (not shown). Bumps 106 are formed on the electrical contacts of the top most surface 108. This top surface 108 is opposite a bottom surface 104 of the die 102. In this embodiment, a protective film 210 is applied to the bottom surface 104 of the die.

The protective film 210 may be formed from any suitable material. For example, the protective film may be formed from a plastic material or epoxy. By way of example, Encapsulant EO 1016 from Dexter Hysol works well. This epoxy is commonly also used as a glob top material for chip-on-board applications that protects the die and wire bonds. The protective film may have any thickness that substantially prevents chipping during the dicing operation and is suitable for the particular application. For example, the protective film may have a thickness that allows laser marking of the thick film without the laser penetrating the thick film. Preferably, the protective film is between about 1.5 and 5 mils. Most preferably, the protective film is between about 2 and 3 mils.

Figure 4:
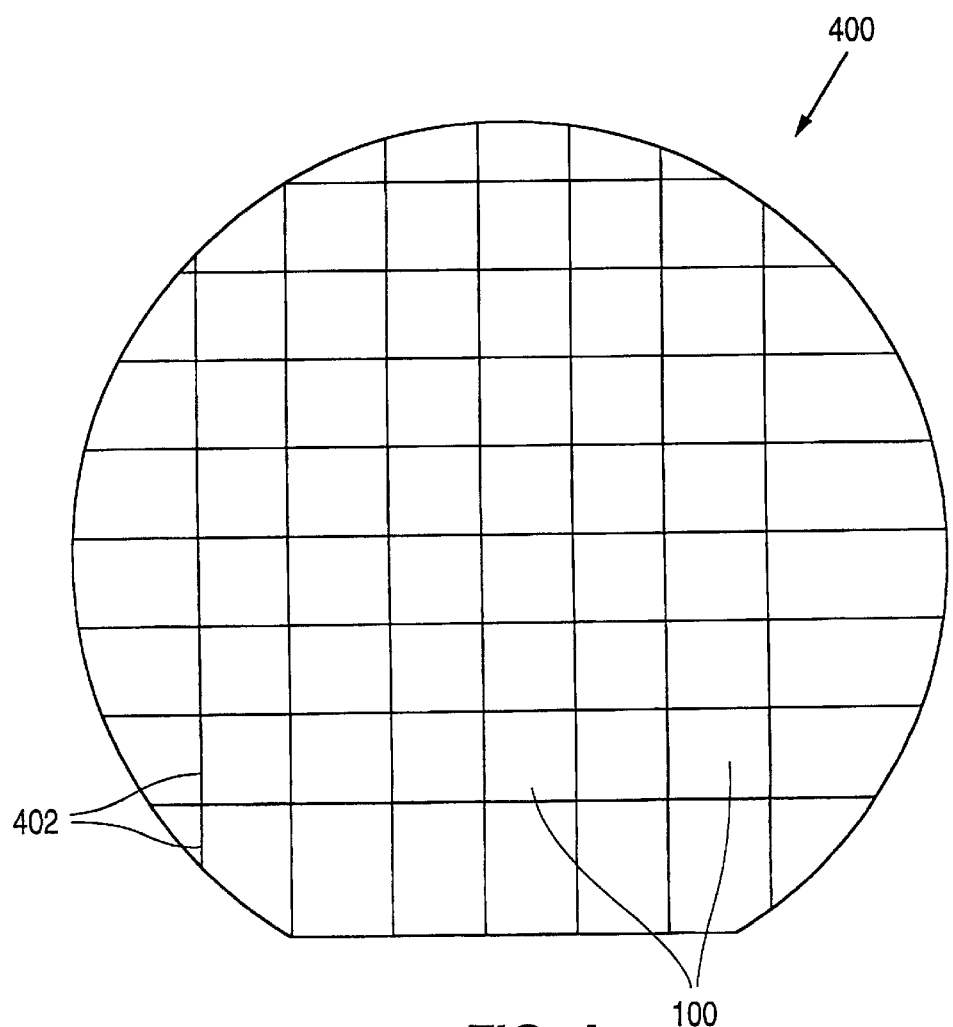
FIG. 4 is a diagrammatic top view of a wafer that includes a plurality of flip chip devices of FIG. 2 in accordance with one embodiment of the current invention.

FIG. 4 is a top view of a wafer 400 that includes a plurality of flip chip devices 200 of FIG. 2 in accordance with one embodiment of the current invention. As shown, the flip chip devices 200 are formed on the wafer 400 in an array pattern. Scribe lines 402 are positioned between each flip chip device 200. When the wafer is diced, the dicing tool cuts along the scribe lines 402, which dicing process is described in detail below in reference to FIG. 5.

A protective film (shown in FIG. 2 as 210) is deposited over the bottom surface of the wafer 400. The top surface of the wafer is opposite the bottom surface. A plurality of electrical contacts may be disposed on the top surface. Additionally, bumps (not shown) may be deposited on the electrical contacts. The protective film 210 of the bottom surface aids in preventing chipping during the wafer dicing process. Preferably, the protective film 210 is in the form of a thick film, and is formed by any suitable process for applying a thick film. In one embodiment, a screen printing process is utilized. By way of another example, a spinning type process may be used, wherein a thick film is spread across the bottom surface of the wafer.

Figure 5:
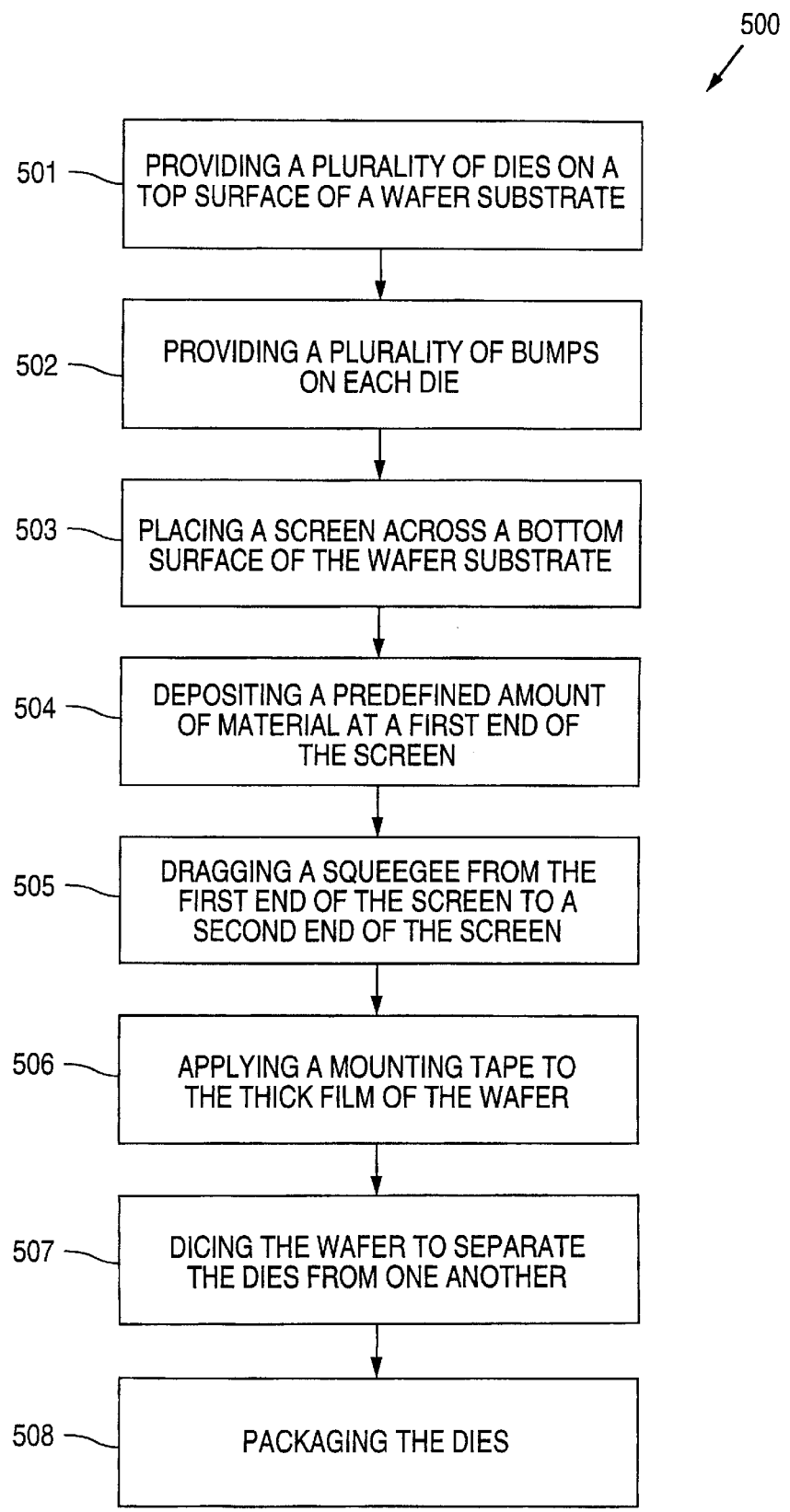
FIG. 5 is a flowchart illustrating the process of fabricating a flip chip bumped wafer that includes screen printing a thick film in accordance with one embodiment of the present invention.

FIG. 5 is a flowchart illustrating the process 500 of fabricating a flip chip bumped wafer that includes screen printing a thick film in accordance with one embodiment of the present invention. Initially, a plurality of dies are provided on a top surface of a wafer substrate in operation 501. As mentioned above, each die includes a plurality of electrical contacts. Next, in operation 502, a plurality of bumps may be deposited on the electrical contacts of each die. The top surface is opposite a bottom surface of the wafer substrate. The dies are formed by depositing a plurality of layers on the top surface of the wafer substrate. The dies may include IC devices such as transistors. The plurality of layers are deposited by conventional fabrication techniques.

After a plurality of dies are provided, in operations 503 through 505 a thick film is printed onto the bottom surface of the wafer substrate. The thick film is applied by any application technique that is suitable for applying a thick film. For example, operations 503 through 505 describe a screen printing process. The screen printing process includes operation 503, in which a screen is placed over the bottom surface of the wafer substrate. Next, in operation 504 a predefined amount of material is deposited at a first end of the screen. In operation 505, a squeegee is dragged from the first end to the opposite end of the screen. As the squeegee is dragged across the screen, the material is deposited through the screen and onto the bottom surface of the wafer substrate. The predefined amount of material is enough to deposit the thick film across the wafer substrate such that the thick film is thick enough to allow laser marking of the thick film without the laser penetrating the thick film. Preferably, the amount of material is also not enough to result in a thick film that is thicker than about 5 mils. Most preferably, the amount is such as to result in a thick film that is between about 2 and 3 mils.

After the thick film is applied, in operation 506 a mounting tape is applied to the thick film. Since the mounting tape is applied over the thick film and the thick film adheres well to mounting tape that has a normal adhesiveness level, the mounting tape need not be extra adhesive, such as UV type tape. In other words, a UV type tape that is especially sticky and requires the application of ultraviolet light to release the tape from the wafer is not required. Preferably, a holding structure (or fixture) is utilized to protect the die and/or bumps during the application of the thick film. That is, the holding structure prevents the die and bumps from moving into another structure, such as the screen frame, while the thick film is being applied.

After the thick film is adhered to the mounting tape, in operation 507 the wafer is diced or sawed using conventional techniques. Any suitable cutting device may be utilized to separate the dies from one another. The cutting device must be hard enough to cut through the wafer and thin enough to cut along a thin scribe line between each die. For example, a thin diamond saw that rotates at around 30,000 rpm may be utilized to cut the dies apart.

After the wafer is diced into individual dies, the dies are packaged, or alternatively, mounted onto a printed circuit board (PCB). For example, the individual flip chip devices are inverted onto a PCB such that'the bumps of the flip chip device are coupled with traces on the PCB.

Figure 3:
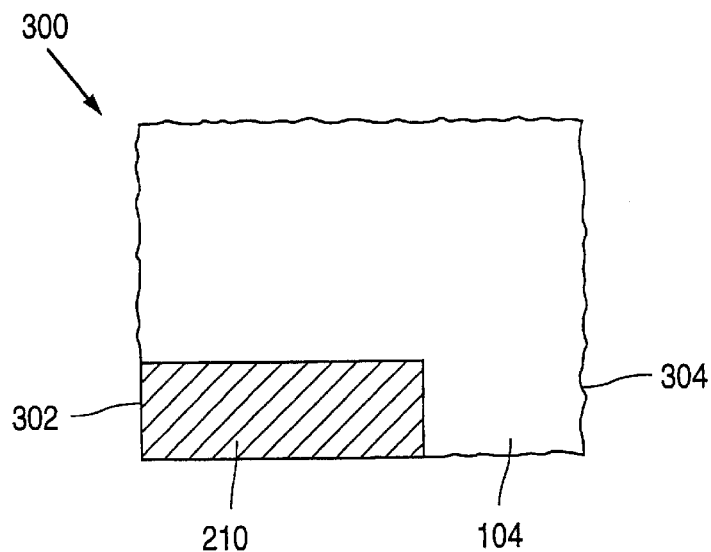
FIG. 3 is a diagrammatic representation of a bottom surface of a flip chip device that illustrates a substantial reduction in chipping as a result of the application of a thick film to a portion of the bottom surface in accordance with one embodiment of the present invention.

The present invention has many advantages. For example, the protective film prevents chipping during the dicing process along the edges of each die. FIG. 3 is a bottom view of a flip chip device 300 that illustrates a substantial reduction in chipping as a result of the application of a protective film 210 to a portion of the bottom surface in accordance with one embodiment of the present invention. As shown, the protective film 210 is applied to a portion of the flip chip device 300, while the remaining portion is exposed bare silicon 104. The reduction in chipping may be seen along the edges (e.g., 302) of the thick film portion 210 of the die. That is, the edges 302 of the thick film portion are relatively smooth. In contrast, the edges (e.g., 304) along the portion of the die over which the protective film is not applied 104 are rough.

Besides reducing chipping, the present invention has other advantages. By way of example, the reduction in chipping results in significantly less damage to the die as a result of stress cracks being formed from the chipped edges. Additionally, the protective film provides mechanical protection and reduces the likelihood of damage to the die during handling. The protective film also provides electrostatic protection, for example, during handling of the devices.

The protective film provides a surface that may be marked by a laser for identification purposes, for example. Also, a higher contrast mark is more possible on the protective film, as opposed to on a bare silicon bottom surface. Although the protective film is markable with a laser, the protective film is thick enough to not allow the laser to penetrate to the die below the protective film. That is, the protective film is thick enough to protect the die from laser damage. Also, the protective film provides protection from light induced bias. As a result of the light protection, it is less likely that light will cause any functional problems. Additionally, the protective film improves adhesion to a mounting tape, and thus, it is possible to use a mounting tape that is not especially adhesive and does not require a UV curing step to separate the mounting tape from the wafer. Thus, an extra process to cure the mounting tape is not required, and as a result, time and costs associated with the dicing process may be reduced. Also, since the protective film adheres well to the mounting tape, the number of dies that become unstuck from the tape and lost during and after dicing may be reduced.

Although the foregoing invention has been described in some detail for purposes of clarity of understanding, it will be apparent that certain changes and modifications may be practiced within the scope of the appended claims. For example, bumps may be disposed on the electrical contacts of each die subsequent to, rather than prior to, the operation of applying the thick film. Accordingly, the present embodiments are to be considered as illustrative and not restrictive, and the invention is not to be limited to the details given herein, but may be modified within the scope and equivalents of the appended claims.

What is claimed is:

1. A packaged integrated circuit device comprising:

a die having a plurality of electrical contacts on a first surface of the die;

a protective film adhered directly to a back surface of the die, the protective film having a thickness that is selected to decrease damage to the die when the die is placed on an external substrate, the protective film being substantially the same size as the back surface of the die.

2. The packaged integrated circuit device recited in claim 1 wherein the protective film is a thick film formed by screen printing.

3. The packaged integrated circuit device recited in claim 1 wherein the packaged integrated circuit device is one selected from the group consisting of a flip chip device, a grid array device, a flash memory device, and a CSP device.

4. The packaged integrated circuit device recited in claim 1 wherein the protective film is a thick film formed from a material that adheres to a mounting tape.

5. The packaged integrated circuit device recited in claim 1 wherein the protective film is a thick film formed from a material that adheres to a mounting tape that is not a UV type tape.

6. A semiconductor wafer comprising:

a multiplicity of semiconductor dies, each die having a plurality of electrical contacts that are exposed on a first surface of the wafer;

a protective thick film adhered directly to a second surface of the wafer, the protective film having a thickness that is selected to reduce chipping along an associated edge of each die while the each die is being separated from the dies, the protective film being substantially the same size as the surfaces of the dies when the chips are separated from the wafer.

7. The semiconductor wafer recited in claim 6 wherein the protective film is formed by screen printing.

* * * * *